United States Patent
Mahany et al.

[11] Patent Number: 5,990,733
[45] Date of Patent: Nov. 23, 1999

[54] DELAY LINE RAMP DEMODULATOR

[75] Inventors: Ronald L. Mahany; Thomas J. Schuster, both of Cedar Rapids, Iowa

[73] Assignee: Intermec IP Corp., Woodland Hills, Calif.

[21] Appl. No.: 09/026,062

[22] Filed: Feb. 19, 1998

Related U.S. Application Data

[60] Provisional application No. 60/038,433, Feb. 19, 1997.

[51] Int. Cl.[6] .................................................. H03D 3/02
[52] U.S. Cl. ........................ 329/336; 329/341; 329/342; 375/324; 455/214
[58] Field of Search ..................................... 329/300, 301, 329/336, 341, 342; 375/324, 328; 455/214

[56] References Cited

U.S. PATENT DOCUMENTS

| | | | |
|---|---|---|---|
| 4,603,301 | 7/1986 | Dukes et al. ............................. | 329/336 |
| 4,988,960 | 1/1991 | Tomisawa ................................ | 329/336 |
| 5,053,717 | 10/1991 | Schulz et al. ........................... | 329/336 |
| 5,345,188 | 9/1994 | Owen ..................................... | 329/336 |

*Primary Examiner*—Siegfried H. Grimm
*Attorney, Agent, or Firm*—Akin, Gump, Strauss, Hauer & Feld, LLP

[57] ABSTRACT

An integrated circuit includes a demodulator having delay circuitry and demodulation control circuitry that may be fully formed within a common integrated circuit. The delay circuitry receives an input signal and generates a delayed input signal. The demodulation control circuitry generates a demodulated output based upon the input signal and the delayed input signal that has a level that is proportional to, or a finction of, a period of a respective cycle of the input signal. The demodulation control circuitry includes pulse generation circuitry, pulse delay circuitry, pulse conversion circuitry and sampling circuitry. The pulse generation circuitry generates a signal pulse based upon the input signal and the delayed input signal with a duration that is proportional to at least one period of the input signal. The pulse delay circuitry generates a delayed signal pulse based upon the signal pulse. The pulse conversion circuitry generates a converted signal that has a level based upon the duration of the signal pulse. The sampling circuitry samples the converted signal based upon a sample pulse to generate the demodulated output based upon the level of the converted signal. The delay circuitry and pulse delay circuitry each include a plurality of cascaded semiconductive elements that, in combination, produce a desired delay duration.

16 Claims, 12 Drawing Sheets

DELAY LINE RAMP DEMODULATOR

CROSS-REFERENCE TO RELATED APPLICATIONS

The present application is based on U.S. Provisional Application Ser. No. 60/038,433 filed Feb. 19, 1997, which is incorporated herein by reference in its entirety.

BACKGROUND

1. Technical Field

The present invention relates generally to the conversion of signals, and, specifically, to a delay line ramp demodulator formed entirely as an integrated circuit that demodulates a modulated signal and that may be employed with other signal conversion and processing circuitry.

2. Related Art

It is well known to modulate and demodulate signals in a signal transmission and receipt process. Typically, a signal of interest is modulated with a carrier signal at a transmit location to produce a modulated signal which is then transmitted or broadcast. The modulated signal may be transmitted via a wired link, a wireless link or a fiber optic link depending upon the particular application. One or more receiving locations receive the modulated signal, demodulate the modulated signal to reproduce the signal of interest and use the signal of interest. Typical applications include audio communication, video communication and data transmission. Commonly used modulation techniques include frequency modulation (FM), phase modulation and frequency shift keying (FSK).

Various demodulation techniques exist for demodulating a composite, intermediate frequency (IF) signal to extract the signal of interest. In a typical installation, dedicated demodulation circuitry employs a particular demodulation technique in demodulating each cycle of the IF signal. Because the IF signal is typically at a high frequency with respect to the signal of interest, the demodulation circuitry must operate within tight tolerances to accurately demodulate each cycle of the IF signal. These tight tolerances must be maintained through all operating temperatures so that the demodulation circuitry accurately reproduces the signal of interest. In prior art demodulation circuitry, high quality, low tolerance lumped elements were employed to precisely tune the demodulation circuitry and to guarantee that the demodulation circuitry would function accurately over all variations in operating temperature.

In prior art implementations, a portion of the demodulation circuitry was formed as an integrated circuit to reduce cost and to reduce power consumption. High quality, tight tolerance external elements were then connected to the integrated circuit via external connections as were required for tuning of the demodulation circuitry. The external elements were expensive and significantly increased the cost of the demodulation circuitry. Further, the external connections typically included lengthy electrical paths that consumed both board space and integrated circuit space. In addition, the external connections were prone to failure, increased power consumption and increased thermal output. Prior art demodulation circuitry typically operated only for specific IF signal frequency ranges. Thus, the demodulation circuitry was designed and built for particular applications and had little use other than in the particular application.

Thus, there lies a need for a demodulator that may be constructed as an integrated circuit that does not require external components. Further, there lies a need for such a device that may be adjusted for the demodulation of various carrier frequencies.

SUMMARY OF THE INVENTION

In one embodiment of the present invention a delay line ramp demodulator includes delay circuitry and demodulation control circuitry that may be fully formed within an integrated circuit. The delay circuitry receives an input signal and delays the input signal to create a delayed input signal. The demodulation control circuitry couples to the delay circuitry and generates a demodulated output based upon the input signal and the delayed input signal. In the embodiment, the demodulated output has a level that is proportional to, or a function of, a period of a respective cycle of the input signal.

The demodulation control circuitry includes pulse generation circuitry, pulse conversion circuitry and sampling circuitry. The pulse generation circuitry couples to the delay circuitry and generates a signal pulse based upon the input signal and the delayed input signal such that the signal pulse has a duration that is proportional to at least one period of the input signal. The pulse conversion circuitry couples to the pulse generation circuitry and generates a converted signal that has a level based upon the duration of the signal pulse. Finally, the sampling circuitry couples to the pulse conversion circuitry and the pulse generation circuitry and samples the converted signal to generate the demodulated output based upon the level of the converted signal.

The pulse generation circuitry may also generate a sample pulse that is used by the sampling circuitry to synchronize sampling of the converted signal. To increase resolution of the demodulator, the pulse generation circuitry may generate the sample pulse with a duration that is proportional to at least one period of the input signal. In another embodiment, the pulse conversion circuitry includes pulse delay circuitry that generates a delayed signal pulse based upon the signal pulse. In the embodiment, the duration of each delayed signal pulse equals or corresponds to a particular signal pulse. The pulse conversion circuitry also includes ramping circuitry coupled to the pulse delay circuitry that generates the converted signal based upon a duration of the delayed signal pulse.

Both the delay circuitry and the pulse delay circuitry may produce adjustable delays based upon respective selection signals. With the demodulator formed as an integrated circuit, the delay circuitry and pulse delay circuitry are formed within the integrated circuit. In one embodiment, the delay circuitry includes a plurality of cascaded semiconductive elements that, in combination, produce a desired delay duration. Further, in the embodiment, the pulse delay circuitry includes a plurality of cascaded semiconductive elements that may be selectively combined based upon a selection signal to produce a desired delay duration.

The demodulator in accordance with the present invention may be constructed as a monolithic integrated circuit on a single semiconductive die in a single process. Thus, the demodulator is less expensive to manufacture than the prior demodulators which required external lumped elements.

Further, the demodulator according to the present invention does not require external connections to external lumped elements that would increase cost, consume board space and consume die space. Without the external elements, the demodulator of the present invention is more reliable than the prior demodulators. Moreover, without the external lumped elements and connects to such, the demodulator according to the present invention consumes less power and generates less heat than the prior demodulators.

Still further, the demodulator according to the present invention includes an embodiment that may be adjusted for differing base frequencies of the input signal and differing frequency variations of the signal of interest contained within the input signal. Thus, the demodulator is more versatile than prior demodulators that operated in only a single operational setting.

Moreover, other aspects of the present invention will become apparent with further reference to the drawings and specification which follow.

DETAILED DESCRIPTION

Figure 1:
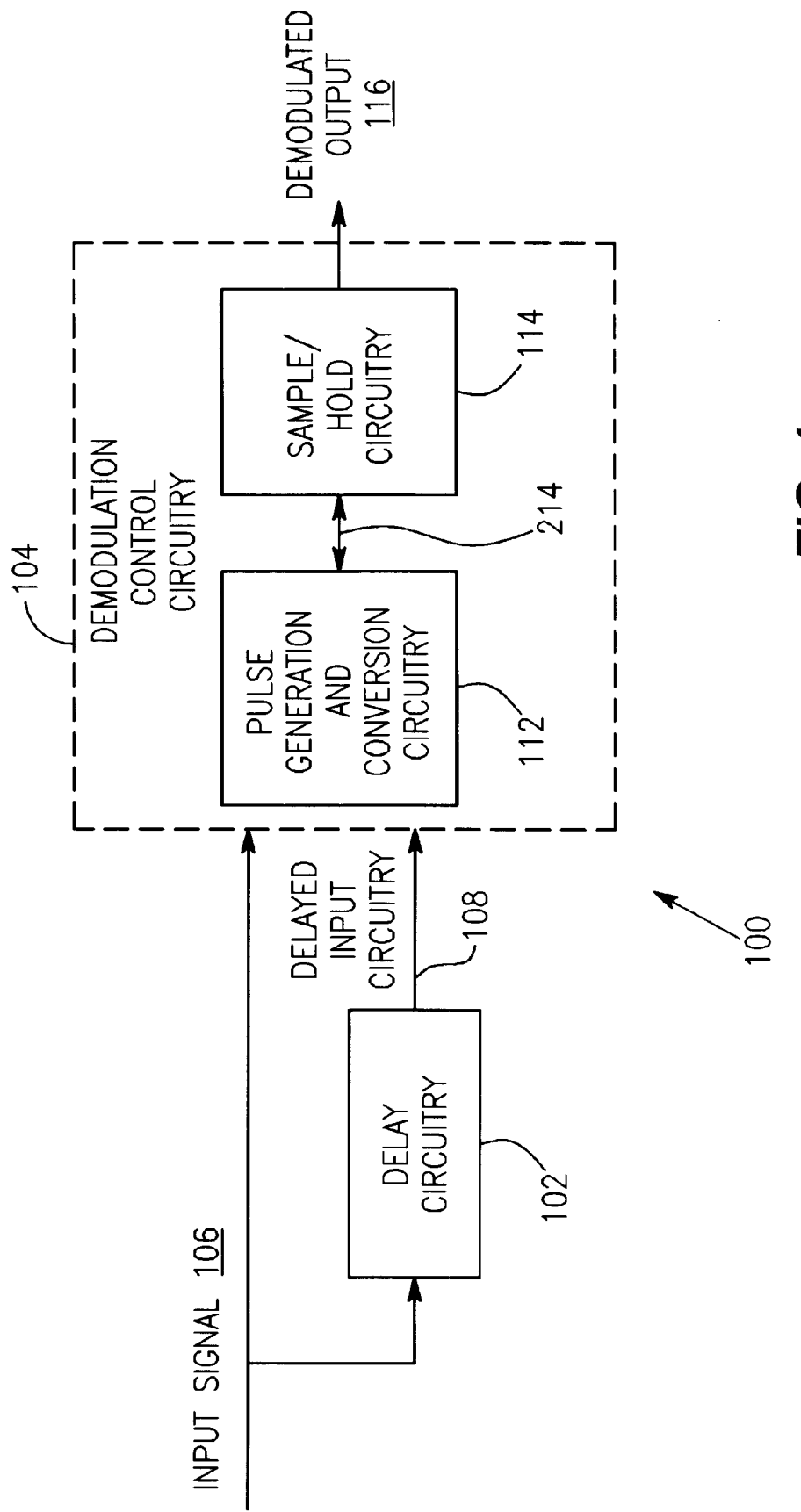
FIG. 1 is a block drawing illustrating generally a demodulator built according to the present invention having delay circuitry and demodulation control circuitry, the demodulator receiving an input signal and producing a demodulated output.

FIG. 1 is a block drawing illustrating generally a delay line ramp demodulator 100 (hereinafter "demodulator") built in accordance with the present invention having input delay circuitry 102 and demodulation control circuitry 104. The demodulator 100 receives an input signal 106 and produces a demodulated output 116. The demodulation control circuitry 104 includes pulse generation and conversion circuitry 112 as well as sampling circuitry 114. The input signal 106 is an intermediate frequency (IF) signal that is a composite of a signal of interest modulated upon a carrier. The demodulated output 116 is a digital representation of the signal of interest.

In an exemplary application of the demodulator 100, the demodulator 100 resides within a radio at a receiving location. RF circuitry in the radio receives a radiated signal via an antenna and produces the IF signal. The demodulator 100 couples to the RF circuitry to receive the IF signal and produces the demodulated output 116 based upon the IF signal. Digital signal processing circuitry samples the demodulated output 116, digitally processes the samples and produces a digitally processed representation of the demodulated output 116. The digitally processed representation of the demodulated output 116 may include an audio signal, digital data or other information. When the digitally processed representation of the demodulated output 116 includes an audio signal, an audio circuit produces an audio output based upon the representation. However, when the digitally processed representation of the demodulated output 116 comprises digital data, the digital data is passed to a processing unit which operates upon the data. Thus, in its operation, the demodulator 100 typically performs a function within a larger system.

During operation of the demodulator 100, the input delay circuitry 102 receives the input signal 106 and produces a delayed input signal 108 based upon the input signal 106. The input signal 106, which is the IF signal, may be a frequency modulated (FM), frequency shift keyed (FSK) or another modulated signal having a signal of interest coupled to a carrier signal. Signal modulation is known and is not further described herein. In one embodiment of the present invention, the IF signal is a square wave oscillating at a base frequency of thirteen megahertz (13 MHz) and with a base period of 76.9231 nanoseconds, such base period varying little during operation. The coupled signal of interest has a maximum frequency deviation of 405 kHz. Therefore, the modulated input signal 106 has a maximum frequency, with frequency error, of 13.405 MHz which corresponds to a minimum period of 74.6 nanoseconds. Further, the modulated input signal 106 has a minimum frequency of 12.595 MHz corresponding to a maximum period of 79.4 nS. Operation of the demodulator 100 conforms to these parameters in the embodiment described.

During operation of the demodulator 100, the input delay circuitry 102 delays the input signal 106 by a consistent delay period to produce the delayed input signal 108. The period of delay produced by the input delay circuitry 102 must be less than the minimum period of the IF signal but must be large enough so as to allow the demodulation control circuitry 104 to perform its other functions as will be described more fully herein. The pulse generation and conversion circuitry 112 receives both the input signal 106 and the delayed input signal 108. The pulse generation and conversion circuitry 112 produces a converted signal 214 based upon the input signal 106 and the delayed input signal 108. The sampling circuitry 114 receives the converted signal 214, samples the converted signal 214 and produces the demodulated output 116.

In one embodiment of the demodulator 100, the level of the converted signal 214 is proportional to, or a function of a period of a corresponding cycle of the input signal 106. In another embodiment of the demodulator 100, the level of the converted signal 214 is proportional to, or a function of the average duration of corresponding adjacent cycles of the input signal 106. In each embodiment, a level of the demodulated output 116 is proportional to, or a function of the level of the converted signal 214. Thus, in one embodiment, the level of the demodulated output 116 is proportional to, or a function of the period of a corresponding cycle of the input signal 106. Further, in another embodiment, the level of the demodulated output 116 is proportional to, or a function of the average duration of corresponding adjacent cycles of the input signal 106. While levels of both the converted signal 214 and the demodulated output 116 may be proportional to a period of one or more corresponding cycles of the input signal 106, the levels may also be a function of periods of such cycle or cycles of the input signal 106. Further references shall be made with reference only to proportionality. However, inherent in such description shall be the understanding that the level of the converted signal 214 and demodulated output 106 may also be a function of periods of such cycle or cycles of the input signal 106.

The demodulator 100 of FIG. 1 is fully implemented in an integrated circuit so that the demodulator 100 requires no external components. Thus, the demodulator 100 may be fully implemented within a monolithic integrated circuit such as an application specific integrated circuit (ASIC), a signal processing device, a signal conversion device or another integrated circuit. Thus, as compared to the prior devices, the demodulator 100 of the present invention is lower in cost, lower in power consumption and more durable than the prior devices which required external components.

Figure 2:
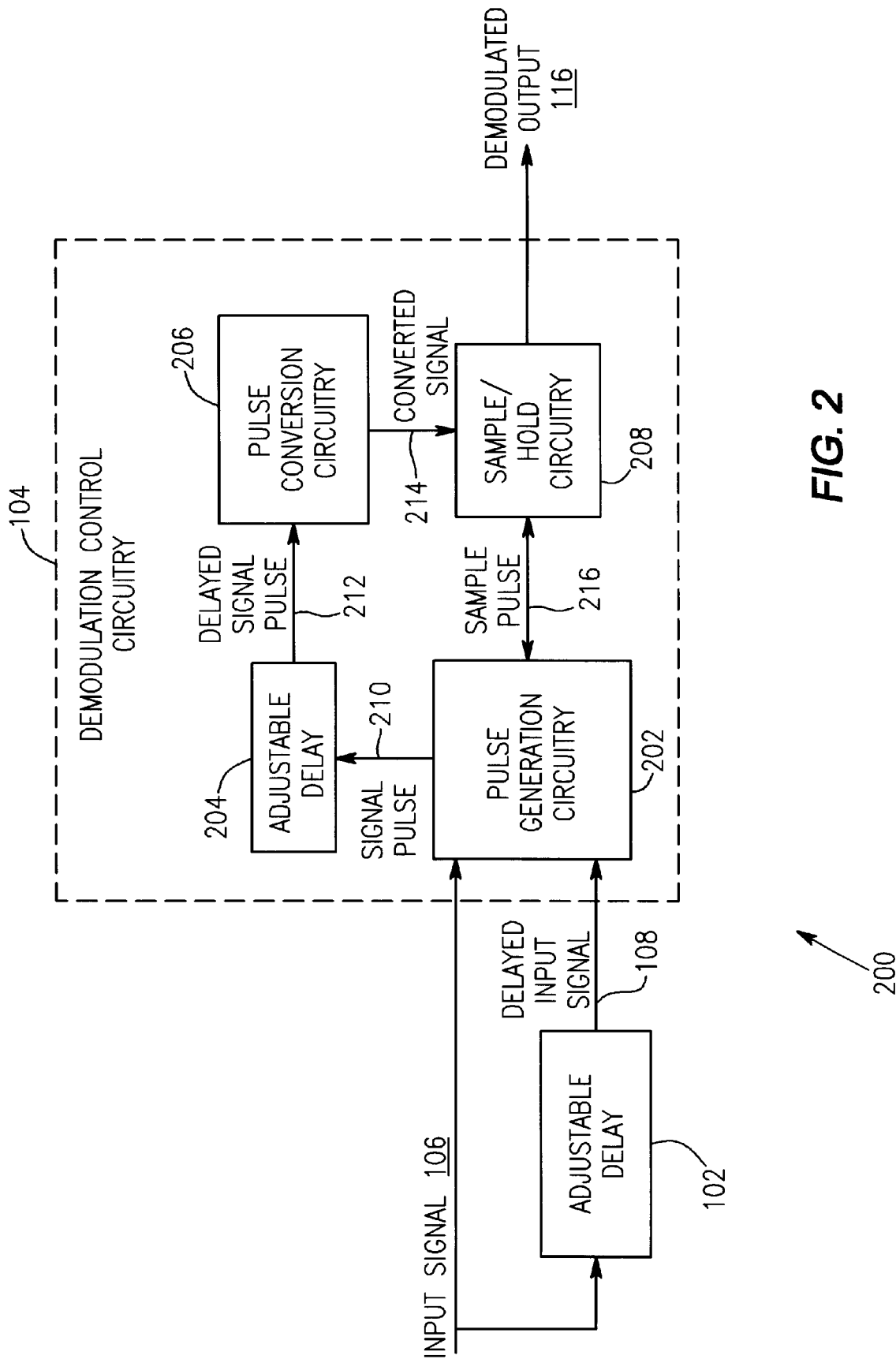
FIG. 2 is a block diagram illustrating an embodiment of the demodulator of FIG. 1 showing in detail components of the demodulation control circuitry.

FIG. 2 is a block diagram illustrating an embodiment of the demodulator 200 of FIG. 1 showing in detail components of the demodulation control circuitry 104. The demodulation control circuitry includes pulse generation circuitry 202, pulse delay circuitry 204, pulse conversion circuitry 206 and sampling circuitry 208. In the demodulator 200, the input delay circuitry 102 includes an adjustable delay whose delay may be altered to produce a delayed input signal 108 for differing base operating frequencies of the input signal 106. However, in another embodiment of the demodulator 200, the input delay circuitry 102 produces a fixed delay corresponding to a particular base operating frequency of the input signal 106.

The pulse generation circuitry 202 receives both the input signal 106 and the delayed input signal 108. Based upon the input signal 106 and the delayed input signal 108, the pulse generation circuitry 202 generates a signal pulse 210 and a sample pulse 216. The signal pulse 210 has a width that, for each cycle of the input signal 106, is proportional to the period of a respective cycle of the input signal 106 or proportional to corresponding adjacent cycles of the input signal 106. The pulse delay circuitry 204 receives the signal pulse 210 and produces the delayed signal pulse 212. The delayed signal pulse 212 is identical in level and duration to the signal pulse 210 but delayed by a delay period. The delay period of the pulse delay circuitry 204 may be adjustable and must be great enough so that no overlap exists between the signal pulse 210 and the delayed signal pulse 212 but not so great as to interfere with other operations of the demodulation control circuitry 104.

The pulse conversion circuitry 206 receives the delayed signal pulse 212 and produces a converted signal 214 having a level that is proportional to the width of the delayed signal pulse 212. Thus, the level of the converted signal 214 is proportional to the period of the input signal 106. The sampling circuitry 208 samples the converted signal 214 upon receipt of a sample pulse 216 from the pulse generation circuitry 202. The sampling circuitry 208 produces the demodulated output 116 which is a proportional to the level of the converted signal 214. Thus, the level of the demodulated output 116 is proportional to the period of a corresponding cycle of the input signal 106 or to the average period of corresponding adjacent cycles of the input signal 106.

Figure 3:
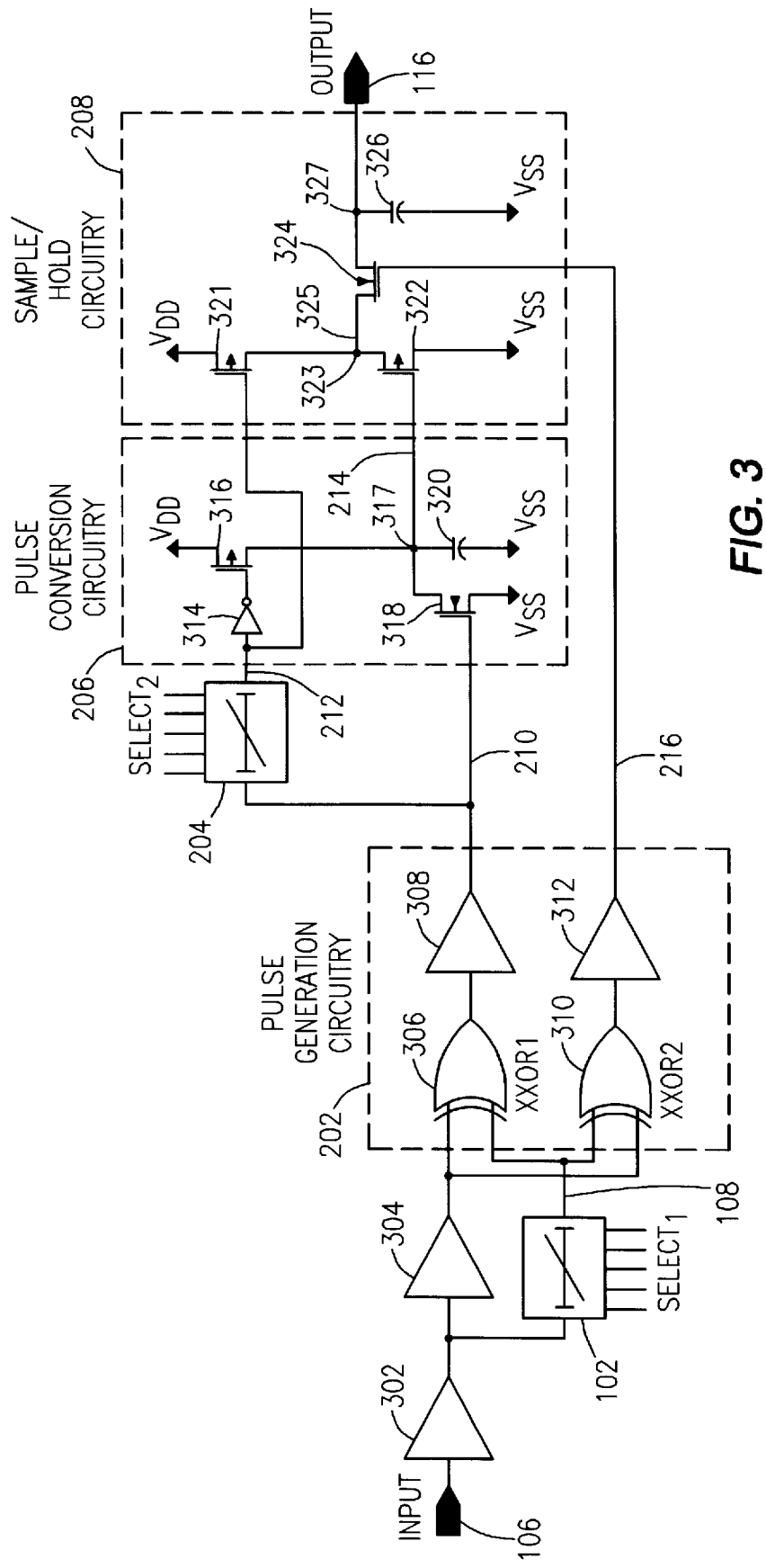
FIG. 3 is a schematic diagram illustrating an embodiment of a demodulator built in accordance with the present invention including with more particularity elements introduced in FIG. 1.

FIG. 3 is a schematic diagram illustrating an embodiment of a demodulator 300 built in accordance with the present invention. The demodulator 300 includes components previously described, including input delay circuitry 102, pulse generation circuitry 202, pulse delay circuitry 204, pulse conversion circuitry 206 and sampling circuitry 208. The demodulator 300 receives the input signal 106 and produces, as the output signal 116, a demodulated representation of the input signal 106.

The demodulator 300 operates, generally, in three distinct segments for each cycle of the input signal 106. During a discharge segment, the pulse generation circuitry 202 generates a signal pulse 210 that has a width proportional to the period (or frequency) of the input signal 106. During a pulse conversion segment, the pulse generation circuitry 206 converts the signal pulse 210 into the converted signal 214. Finally, during a sampling segment, the sampling circuit 208 samples the converted signal 214 and generates the demodulated output 116 which is held for sampling. Each of these segments commences with reference to a rising edge of the input signal 106. As will be more fully explained hereinafter, segments of operation of the operating cycle of the demodulator 300 overlap with other segments of the operating cycle although the various segments commence in a repeating sequence.

The demodulator 300 includes a first buffer 302 that receives the input signal 106 and provides the input signal 106 to both a second buffer 304 and the input delay circuitry 102. In the embodiment illustrated, the input delay circuitry 102 is a variable delay current mode logic (CML) delay line whose delay is controlled by a $SELECT_1$ signal. The $SELECT_1$ signal alters the bandgap resistance of the CML delay line which alters the delay of the delay line from 25 nanoseconds to 90 nanoseconds. However, in another embodiment of the demodulator, the delay produced by the input delay circuitry 102 is fixed.

By using CML logic within the input delay circuitry 102, the input delay circuitry 102 provides substantially constant delay across a wide temperature range. Various logic circuits may be employed using CML logic to produce the adjustable delay. In other embodiments, other logic types, such as complementary metal-oxide-silicon (CMOS) are employed to produce the input delay. However, in any construction, the input delay circuitry 102 provides a consistent delay across the operating range of the demodulator 300. Feedback mechanisms within the input delay circuitry 102 may be employed in other embodiments to automatically adjust the $SELECT_1$ signal to compensate for variations in input delay across the operating range of the demodulator 300.

Second buffer 304 reproduces the input signal 106 while the input delay circuitry 102 produces the delayed input signal 108. The pulse generation circuitry 202 receives both the input signal 106 and the delayed input signal 108 and includes a first XXOR gate 306 and a second XXOR gate 310. The first XXOR gate 306 receives as its A input the input signal 106 and as its B input the delayed input signal 108. The second XXOR gate 310 receives as its A input the delayed input signal 108 and as its B input the input signal 106. Both the first XXOR gate 306 and the second XXOR gate 310 operate in accordance with the following truth table:

TABLE 1

| A | B | OUT |
|---|---|-----|
| 0 | 0 | 0 |
| 0 | 1 | 0 |
| 1 | 0 | 1 |
| 1 | 1 | 0 |

Thus, the first XXOR gate 306 produces a logic high output only when the input signal 106 is logic high and the delayed input signal 108 is logic low. Further, the second XXOR gate 310 produces a logic high output only when the delayed input signal 108 is logic high and the input signal 106 is logic low. Buffer 308 receives the output of the first XXOR gate 306 and converts the level of the signal from a CML level to a CMOS level to produce the signal pulse 210 at a CMOS logic level. Further, buffer 312 receives the output of the second XXOR gate 310 and converts the level of the signal from a CML level to a CMOS level to produce the sampling pulse 216 at a CMOS logic level. Remaining components of the demodulator 300 in the embodiment illustrated are implemented in CMOS as opposed to the CML construction of the input delay circuitry 102 and the pulse generation circuitry 202. However, in other embodiments all components of the demodulator 300 could be implemented fully in CML or fully in CMOS.

Pulse delay circuitry 204 and pulse conversion circuitry 206 each receive the signal pulse 210. The pulse conversion circuitry 206 includes an inverter 314, a ramping transistor 316, a discharge transistor 318 and a signal conversion capacitor 320. The pulse delay circuitry 204 is programmed via a SELECT$_2$ signal to delay the signal pulse 210 by a delay period to produce the delayed signal pulse 212. The signal pulse 210 couples directly to the discharge transistor 318 to enable the discharge transistor 318. The discharge transistor 318 operates to provide a shunt path from node 317 where the converted signal 214 is produced to V$_{SS}$ during a discharge segment of the operating cycle of the demodulator 300.

The inverter 314 inverts the delayed signal pulse 212 and drives the gate of ramping transistor 316. When the delayed signal pulse 212 is logic high, during a pulse conversion segment of the operating cycle, the inverter 314 produces a logic low signal to turn on the ramping transistor 316. When turned on, the ramping transistor 316 charges the signal conversion capacitor 320 to produce the converted signal 214 at node 317. The inverter 314 turns on the ramping transistor 316 only when the delayed signal pulse 212 is logic high.

The delay provided by the pulse delay circuitry 204 must be greater than the maximum pulse width of the signal pulse 210 so that the signal pulse 210 does not enable the discharge transistor 318 to discharge the signal conversion capacitor 320 when the ramping transistor 316 is enabled. In the described embodiment, the width of the signal pulse 210 is approximately 10 nanoseconds at a minimum and 25 nanoseconds at a maximum so as to allow a sampling of the signal conversion capacitor 320 prior to a discharge segment of the operating cycle. Thus, the pulse delay circuitry 204 produces a delay within the required delay range.

The sampling circuitry 208 includes a pull-up transistor 321, a pull-down transistor 322, a sampling transistor 324 and a sample holding capacitor 326. During a pulse conversion segment of the operating cycle, the converted signal 214 is produced at node 317 with the level of the converted signal 214 produced corresponding to a pulse width of the delayed signal pulse 212. Thus, after the pulse conversion segment of the operating cycle, the voltage at node 317 is raised to a voltage level that is proportional to the width of the delayed signal pulse 212. During the sampling segment of the operating cycle, the voltage at node 317 partially turns off the pull-down transistor 322 based upon the voltage at node 317, the pull-down transistor 322 pulling down sample voltage 325 at node 323 toward V$_{SS}$. Concurrently, with the delayed signal pulse 212 logic low, the pull-up transistor 321 which is turned on by the logic low level of the delayed signal pulse 212 pulls up the sample voltage 325 at node 323 toward V$_{DD}$. Because the pull-down transistor 322 is partially on, the level of the sample voltage 325 at node 323 depends upon the degree to which the pull-down transistor 322 is turned off by the level of the converted signal 214 at node 317. Thus, the level of the sample voltage 325 at node 323 is proportional to the level of the converted signal 214 at node 317.

When the sampling transistor 324 is enabled by the sample pulse 216, the sample voltage 325 at node 323 is coupled to the sample holding capacitor 326 at node 327. After the sampling segment of the operating cycle has been completed, the output signal 116 is produced at node 327 as the OUTPUT. The demodulated output 116 is therefore proportional to the converted signal 214 and resultantly proportional to a width of the signal pulse 210. The width of the signal pulse 210 corresponds to the period of at least one cycle of the input signal 106. Thus, the level of the output signal 106 corresponds to the period of at least one cycle of the input signal 106.

Figure 4:
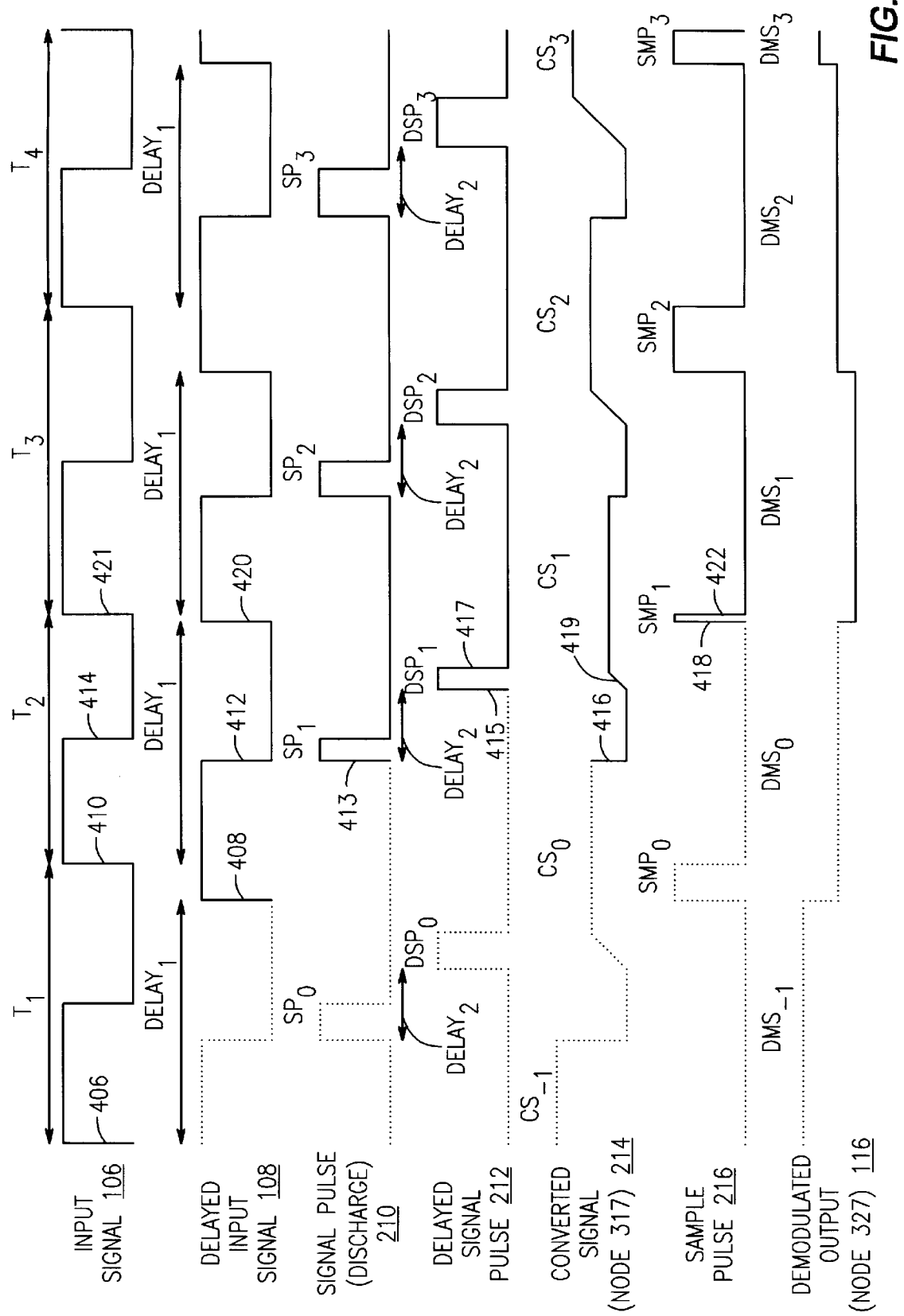
FIG. 4 is a signal timing diagram illustrating signal transitions produced during operation of the demodulator of FIG. 3.

FIG. 4 is a signal timing diagram illustrating signal transitions produced during operation of the demodulator 300 of FIG. 3. FIG. 4 illustrates four periods, T$_1$, T$_2$, T$_3$ and T$_4$ of the input signal 106 that represent four cycles of the input signal 106 (IF signal) received by the demodulator 300 of FIG. 3 at the INPUT. Each of the four periods of the input signal 106, T$_1$, T$_2$, T$_3$ and T$_4$ corresponds to respective discharge, pulse conversion and sampling segments of respective operating cycles of the demodulator 300. As will be flirther described herein, the segments of the operating cycle of the demodulator 300 repeat for each and every cycle of the input signal 106.

Operation corresponding to period T$_1$ initiates at rising edge 406 of period T$_1$ of the input signal 106. At rising edge 406, the input delay circuitry 102 initiates a delay period (DELAY$_1$) and produces the delayed input signal 108 such that it has a rising edge 408 commencing at a time DELAY$_1$ after the rising edge 406 of the input signal 106. However, while period T$_1$ of the input signal 106 commences and continues, the demodulator 300 continues segments of an operating cycle corresponding to cycle T$_0$ of the input signal 106 which is not shown. At rising edge 406 of the input signal corresponding to period T$_1$, the demodulator 300 is in the discharge segment of its operating cycle corresponding to period T$_0$ wherein the demodulator 300 generates signal pulse 210 at SP$_0$ that enables the discharge transistor 318 to discharge the signal conversion capacitor 320.

Next, the demodulator 300 enters a pulse conversion segment of its operating cycle corresponding to period T$_0$ of the input signal wherein the delayed signal pulse 212 at SMP$_0$ causes the pull-up transistor 316 to generate the converted signal 214 at node 317. Then, the demodulator 300 enters the sampling segment of its operating cycle corresponding to the cycle T$_0$ of the input signal 106 wherein the sample pulse 216 is logic high at SMP$_0$, the sampling transistor 324 is turned on and the sample voltage 325 present at node 323 is coupled to node 327 as $DMS_0$. When the sample pulse 216 goes logic low at the falling edge of $SMP_0$ the sampling transistor 324 turns off and the coupled charge is held at node 327 by the sample holding capacitor 326 to produce the output signal 116 corresponding to cycle $T_0$ of the input signal 106. Thus, the sample pulse 216 at $SMP_0$ produced during period $T_1$ of the input signal 106 demodulator 300 samples the sample voltage 325 generated during the prior operating cycle of the demodulator 300 corresponding to cycle $T_0$ of the input signal 106.

Next, the demodulator 300 enters the discharge segment of its operating cycle corresponding to cycle $T_1$ of the input signal 106. When the delayed input signal 108 goes logic low at falling edge 412 while the input signal 106 is still logic high during cycle $T_2$ of the input signal 106, the pulse generation circuitry 202 drives the signal pulse 210 logic high at $SP_1$. The logic high level of the signal pulse 210 at $SP_1$ enables the discharge transistor 318 which discharges the signal conversion capacitor 320 to drive the converted signal 214 at node 317 to $V_{SS}$.

As previously discussed, the sample pulse 216 at $SMP_0$ must go to a logic low level and turn off the sampling transistor 324 prior to the signal pulse 210 going logic high at $SP_1$ and enabling the discharge transistor 318. Simply stated, the converted signal 214 at node 317 must be sampled by the sampling circuitry 208 prior to discharge of the converted signal 214 at node 317 by the discharge transistor 318 upon enablement of the signal pulse 210. FIG. 4 illustrates the discharge of the converted signal 214 at falling edge 416 caused by the logic high signal pulse 210 at $SP_1$. Of course, the level of the converted signal 214 at falling edge 416 exhibits an exponential decay as the level of the 402 moves to $V_{SS}$.

Once the signal conversion capacitor 320 is discharged and converted signal 214 at node 317 is driven toward $V_{SS}$, the demodulator 300 enters a pulse conversion segment of its operating cycle corresponding to cycle $T_1$ of the input signal 106. During the pulse conversion segment, the delayed signal pulse 212 goes logic high at rising edge 415 of delayed signal pulse 212 at $DSP_1$ which occurs after delay period $DELAY_2$ of the pulse delay circuitry 204 from rising edge 413 of signal pulse 210 at $SP_1$. As was previously discussed, the delay period $DELAY_2$ of the pulse delay circuitry 204 must be greater than the greatest width of a corresponding signal pulse 210 (here, $SP_1$) but not so great as to have the delayed signal pulse 212 at $DSP_1$ be logic high during the subsequent logic high pulse of the sample pulse 216 at $SMP_1$. When the delayed signal pulse 212 at $DSP_1$ goes logic high at rising edge 415, the inverter 314 turns on the ramping transistor 316 to pull the converted signal 214 at node 317 toward $V_{DD}$. The ramping transistor 316 continues to pull the converted signal 214 at node 214 toward $V_{DD}$ until the delayed signal pulse 212 goes logic low at falling edge 417 of $DSP_1$.

As will be further described herein, the capacitance of the signal conversion capacitor 320 is selected so that for the full range of operation of the demodulator 300, the voltage at node 317 is raised to an operating range voltage that provides sufficient resolution to distinguish the various widths of the pulses of the delayed signal pulse 212. As illustrated, when the delayed signal pulse 212 is logic high during pulse $DSP_1$, the converted signal 214 at node 317 ramps from its discharged level toward $V_{DD}$ at a ramp rate during ramp 419. The ramping transistor 316 is selected to produce a desired ramp rate so that resolution may be established across the operating range of the demodulator 300. In another embodiment, a series resistance may be added between the ramping transistor 316 and the signal conversion capacitor 320 to calibrate operation of the demodulator 300. After pulse $DSP_1$ of the delayed signal pulse 212 goes logic low, the converted signal 214 has been raised to a level proportional to the width of pulse $DSP_1$ of the delayed signal pulse 212.

As illustrated, period $T_1$ of the input signal 106 is delayed by the input delay circuitry 102 to produce the delayed input signal 108. Thus, the delayed input signal 108 is a duplicate of the input signal 106 delayed by the period $DELAY_1$. In the embodiment illustrated, the input signal 106 has a 50% duty cycle. Therefore, the input signal 106 goes from logic high to logic low at a time one-half of its corresponding period after it goes from logic low to logic high. Likewise, the delayed input signal 108 goes from logic high to logic low at a time one-half of its corresponding period after it goes from logic high.

Pulse $SP_1$ of the signal pulse 210 goes from logic low to logic high upon a falling edge of the delayed input signal 108 and goes from logic high to logic low upon a falling edge of a subsequent cycle $T_2$ of the input signal 106. Thus, with reference to the start of period $T_1$ of the input signal 106, the signal pulse 210 at $SP_1$ goes logic high at time $(DELAY_1+0.5*T_1)$. Further, with reference to the start of period $T_1$, the signal pulse 210 at $SP_1$ goes logic low at time $(T_1+0.5*T_2)$ wherein $T_2$ is the period of the subsequent cycle of the input signal 106. Thus, the width of the $SP_1$ pulse of the signal pulse 210 is equal to $(T_1+0.5*T_2)-(DELAY_1+0.5*T_1)=0.5*(T_1+T_2)-DELAY_1$. Thus, the width of the signal pulse 210 at $SP_1$ is proportional to the average periods of cycles $T_1$ and $T_2$ of the input signal 106, effectively averaging the periods of successive periods of the input signal 106.

The width of pulses of the delayed signal pulse 212 equals the width of pulses of the signal pulse 210. Thus, the delayed signal pulse 212 at $DSP_1$ has a width equal to the signal pulse 210 at $SP_1$. During pulse $DSP_1$ of the delayed signal pulse 212, the converted signal 214 ramps from a discharged state to a level corresponding to level proportional to the width of the delayed signal pulse 212 at $DSP_1$. Thus, the level of the converted signal 214 is proportional to the average of periods $T_1$ and $T_2$ of the input signal 106.

After the delayed signal pulse 212 goes logic low at the falling edge 417 of pulse $DSP_1$, the pull-up transistor 321 turns back on due to the logic low level of the delayed signal pulse 212. Thus, the pull-up transistor 321 pulls the sample voltage 325 at node 323 toward $V_{DD}$. However, because the converted signal 214 at node 317 couples to the gate of the pull-down transistor 322, the pull-down transistor 322 attempts to pull the sample voltage 325 at node 3123 to $V_{SS}$ depending upon the voltage level of the converted signal 214 at node 317. The pull-down transistor 322 is turned on by a logic low voltage and turned off by a logic high voltage. The pull-down transistor 322 is turned off by an amount depending upon the level of the sample converted signal 214 at node 317. Thus, the level of the sample voltage 325 at node 323 proportional to the level of the converted signal 214 at node 317.

Next, the demodulator 300 enters a sampling, segment of its operation corresponding to cycle $T_1$ of the input signal 106. During, the sampling segment of the operating cycle of the demodulator 300, the pulse generation circuitry 202 drives the sample pulse 216 logic high at pulse $SMP_1$. The sample pulse 216 at $SMP_1$ goes logic high when the delayed input signal 108 is logic high but the input signal 106 is logyic low, such interval commencing upon the rising edge 420 of the delayed input signal 108 corresponding to cycle T$_2$ of the input signal 106 and ceasing at the rising edge 421 of the subsequent cycle T$_3$ of the input signal 106. When the sample pulse 216 goes logic high at low to high transition 418 of pulse SMP$_1$, the sample pulse 216 enables the sampling transistor 324 to couple the sample voltage 325 at node 323 to output node 327 thereby charging the sample holding capacitor 326 to produce the demodulated output signal 116 as DMS$_1$. After transition 422 of SMP$_1$ of the sample pulse 216, the demodulated output 116 at node 327 is available for sampling by other circuitry. Thus, operation corresponding to cycle T$_1$ of the input signal 106 completes. Additional operating cycles corresponding to subsequent cycles of the input signal 106 are illustrated in FIG. 4 but will not be further described herein.

Circuitry that may sample the demodulated output 116 at the OUTPUT may include a data slicer or other sampling circuitry. The sampling circuitry may include compensating circuitry that compensates for any non-linearity of the demodulator 300 that may occur. Because further digital signal processing may be performed to compensate for any non-linearities or may operate indifferently to non-linearities of the demodulator 300, compensating circuitry may not be required.

Figure 5A:
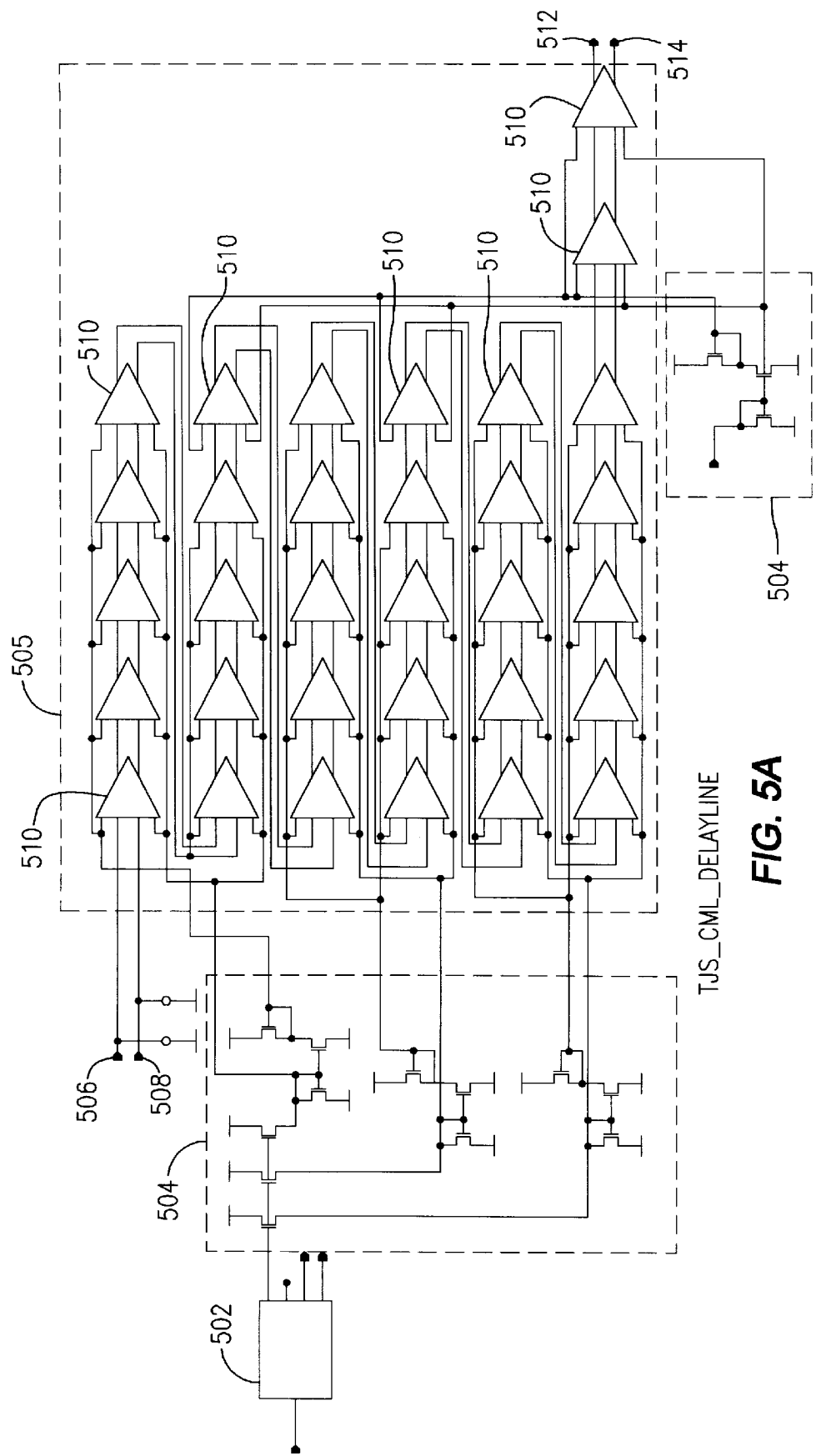
FIG. 5A is a schematic diagram illustrating an embodiment of delay circuitry according to the present invention, the delay circuitry including a plurality of delay elements.

FIG. 5A is a schematic diagram illustrating an embodiment of delay circuitry 500 according to the present invention. The delay circuitry 500 includes an enabling circuit 504 and a delay block 505 and operates in a differential mode to produce a delay. Enabling circuitry input block 502 controls operation of enabling circuit 504 that, when enabled, enables operation of the delay block 505. The delay block 505 receives positive input 506 and negative input 508 and, when enabled, produces positive delayed output 512 and negative delayed output 514. However, when disabled by the enabling circuit 504, the delay block 505 produces no delayed signals.

The delay block 505 includes a plurality of delay elements 510 that are cascaded to produce the desired delay. In the embodiment illustrated, each of the delay elements 510 produces approximately 2.1875 nS of delay such that, in combination, the delay elements 510 produce a total delay of approximately 70 nS of delay. However, in other embodiments, a differing number of delay elements 510 may be cascaded to produce a differing desired total delay. Further, in other embodiments, the delay elements 510 may be selectively switched to produce varying total delays.

Figure 5B:
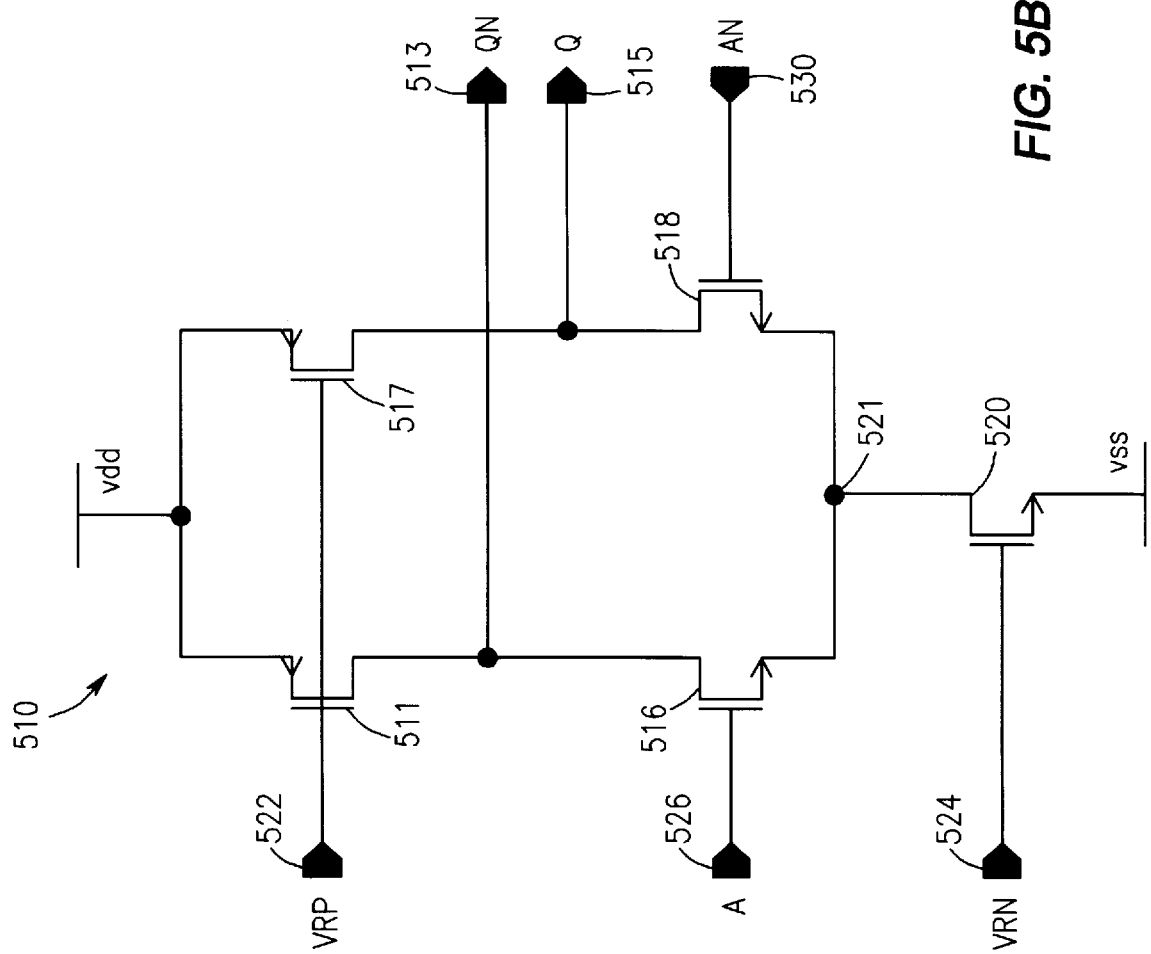
FIG. 5B is a schematic diagram illustrating an embodiment of delay elements incorporated in the delay circuitry of FIG. 5A.

FIG. 5B is a schematic diagram illustrating an embodiment of a delay element 510 incorporated into the delay circuitry 500 of FIG. 5A to produce an elemental delay. In the embodiment illustrated, the delay element 510 is formed within a CML circuit although other logic types could be used in different embodiments. The delay element 510 includes a first pull-up transistor 511, a second pull-up transistor 517, first delay transistor 516, second delay transistor 518 and pull-down transistor 520.

The first pull-up transistor 511 connects between V$_{DD}$ and negative output 513 and is enabled by V$_{RP}$ 522 that is produced by enabling circuit 504. The second pull-up transistor 517 connects between V$_{DD}$ and positive output 515 and is also enabled by V$_{RP}$ 522. The pull-down transistor 520 connects between V$_{SS}$ and negative reference node 521 and is enabled by V$_{RN}$ that is produced by enabling circuitry 504. With the delay circuitry 500 enabled, V$_{RP}$ is asserted at V$_{SS}$ to turn on pull-up transistors 511 and 517 and V$_{RN}$ is asserted at V$_{DD}$ to turn on pull-down transistor 520.

The first delay transistor 516 connects between negative reference node 521 and negative output 513 and is switched by positive input 526 applied at its gate. When turned off by a logic low level of positive input 526, the first delay transistor 516 allows the negative output 513 to be pulled logic high by the first pull-up transistor 511. However, on a low to high transition of the positive input 526, the first delay transistor 516 produces a high to low transition at the negative output 513 after an inherent operational delay of the first delay transistor 516 of approximately 2.1875 nS. While the positive input 526 remains logic high, the negative output 513 remains logic low. On a high to low transition of the positive input 526, the first delay transistor 516 produces a low to high transition at the negative output 513 after an inherent operational delay of the first delay transistor 516. While the positive input 526 remains logic low, the negative output 513 remains logic high.

The second delay transistor 518 connects between negative reference node 521 and positive output 515 and is enabled by negative input 530. When turned off by a logic low level of negative input 530, the second delay transistor 518 allows the positive output 515 to be pulled logic high by the first pull-up transistor 511. However, on a low to high transition of the negative input 530, the second delay transistor 518 produces a high to low transition at the positive output 515 after an inherent operational delay of the second delay transistor 518 of approximately 2.1875 nS. While the negative input 530 remains logic high, the positive output 515 remains logic low. On a high to low transition of the negative input 530, the second delay transistor 518 produces a low to high transition at the positive output 515 after an inherent operational delay of the second delay transistor 518. While the negative input 530 remains logic low, the positive output 515 remains logic high. Thus, in combination, the components of the delay element 510 produce a delayed representation (delayed by an elemental delay) of a differential input signal.

Figure 5C:
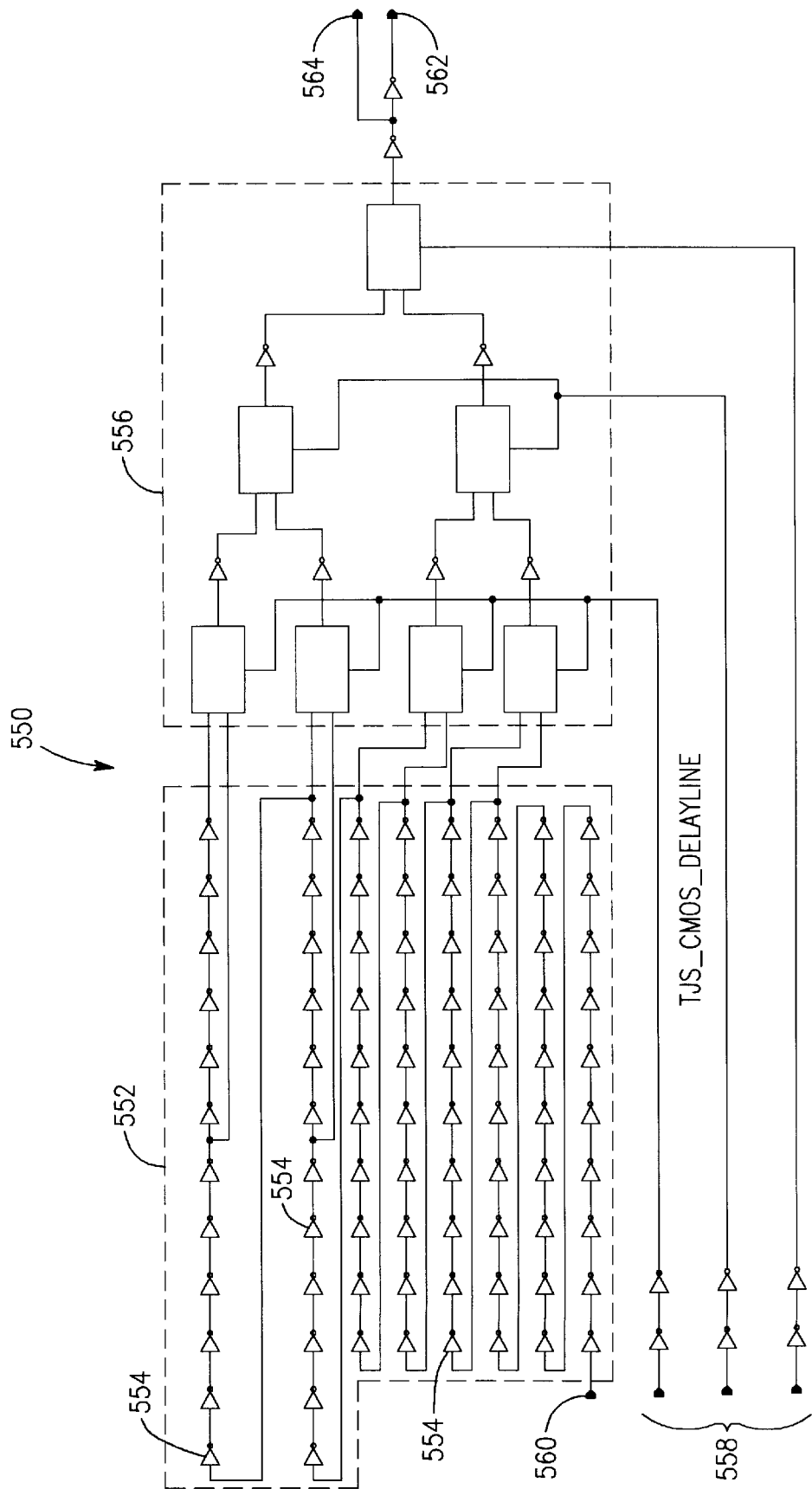
FIG. 5C is a schematic diagram illustrating an embodiment of adjustable delay circuitry according to the present invention, the adjustable delay circuitry including a plurality of delay elements that may be connected in a variety of configurations to produce an adjustable delay.

FIG. 5C is a schematic diagram illustrating an embodiment of adjustable delay circuitry 550 according to the present invention. The adjustable delay circuitry 550 includes a plurality of delay elements 554 contained in delay block 552 and delay selection circuitry 556 operably coupled to produce a positive delayed output 562 and a negative delayed output 564 based upon an input signal 560. The duration of delay produced by the adjustable delay circuitry 556 is selected by a three bit select signal 558. In one embodiment, the adjustable delay circuitry 550 is provided as the pulse delay circuitry 204 of FIG. 3. Thus, the three bit select signal 558 corresponds to signal SELECT$_2$ of the demodulator 300 of FIG. 3.

The delay block 552 includes the plurality of delay elements 554, each of which produces an elemental delay. As illustrated, the delay elements 554 are grouped into eight separately connected groups. Based upon the three bit select signal 558, delay selection circuitry 556 cascades the groups of delay elements 554 to produce differing durations of delay. In the embodiment illustrated, the adjustable delay circuitry 550 produces between approximately 10 nanoseconds and 25 nanoseconds of delay depending upon the SELECT$_2$ signal with each of the delay elements 554 producing approximately 0.3 nanoseconds of delay.

Figure 5D:
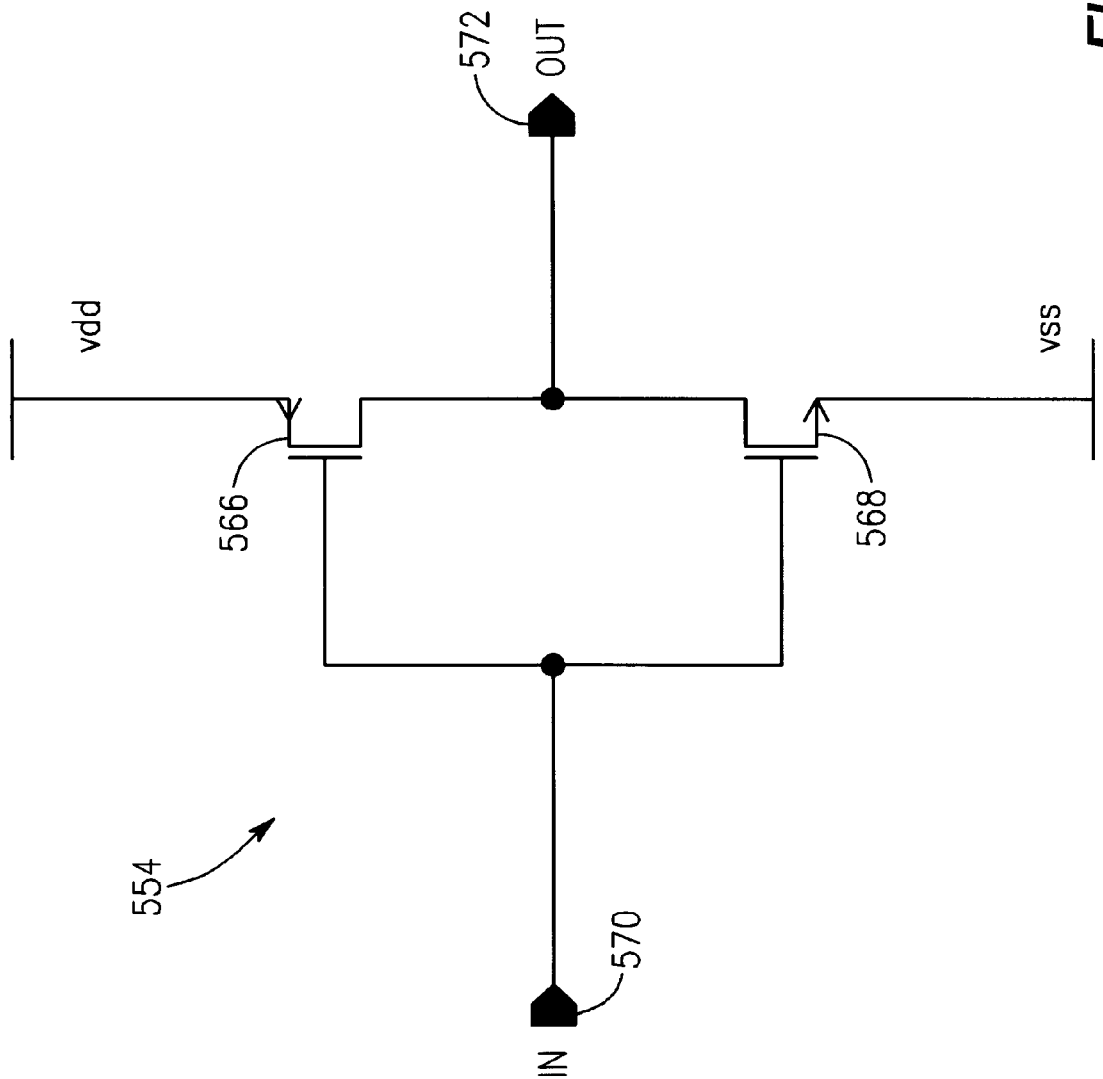
FIG. 5D is a schematic diagram illustrating an embodiment of delay elements employed in the adjustable delay circuitry of FIG. 5C.

FIG. 5D is a schematic diagram illustrating an embodiment of a delay element 554 employed in the delay circuitry 550 of FIG. 5C. The delay element 554 includes a pull-up transistor 566 and a pull-down transistor 568 coupled to form a standard inverter. Pull-up transistor 566 connects between V$_{DD}$ and output 572 and is controlled by input 560. Pull-down transistor 568 connects between V$_{SS}$ and the output 572 and is controlled by input 570. Thus, upon any transition of the input 570 causes a delayed and inverted transition at the output 572, the delay caused by the inherent delay of operation of the transistors 566 and 568. In its operation, at transitions of the input 570, the delay element 554 produces inverted representations of the input 570 at its output 572, such inverted representation produced after the inherent delay of the pull-up transistor 566 and pull-down transistor 568. In the embodiment illustrated, the delay element 554 is formed in a CMOS circuit. However, in other embodiments, the delay element 554 may be formed in other logic types.

Figure 6:
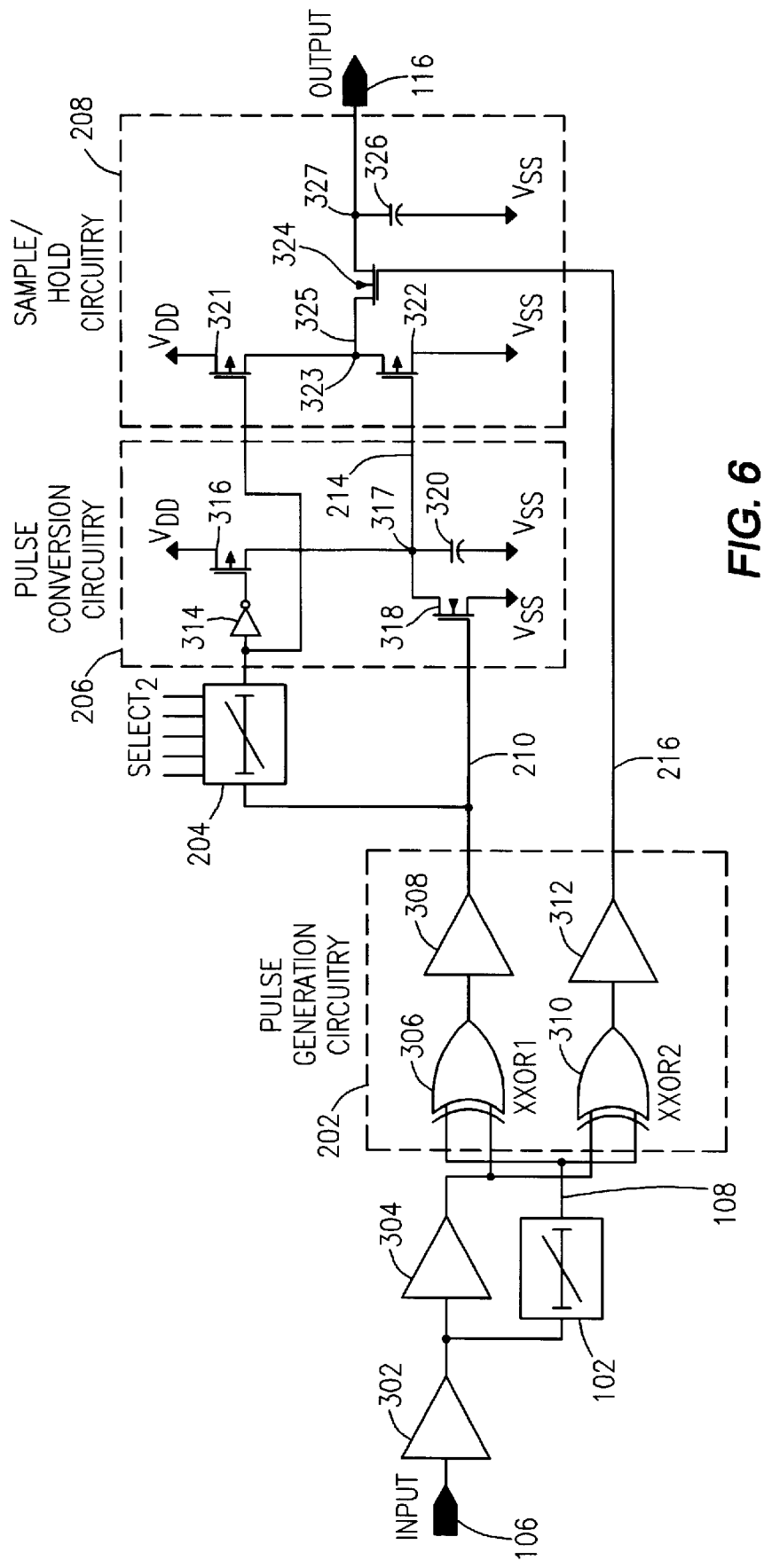
FIG. 6 is a schematic diagram of another demodulator built according to the present invention similar in construction to the demodulator of FIG. 3 but with differing connections to produce differing operating properties.

FIG. 6 is a schematic diagram of another demodulator 600 built in accordance with the present invention. The demodulator 600 includes various components previously described with respect to FIG. 3. These components will not be further described except to expand on the teachings of the present invention. The demodulator 600 includes input delay element 102, pulse generation circuitry 202, pulse delay circuitry 204, pulse conversion circuitry 206 and sampling circuitry 208. The circuitry of the demodulator 600 is substantially in accordance with the circuitry of the demodulator 300 but includes differing connections that generate the signal pulse 210, the delayed signal pulse 212 and the sample pulse 216 in a differing fashion. Thus, the operation of the demodulator 600 of FIG. 6 differs from the operation of the demodulator 300 of FIG. 3.

The input delay circuitry 102 receives the input signal 106 and produces the delayed input signal 108 having a fixed delay with respect to the input signal 106. The first XXOR gate 306 of the pulse generation circuitry 202 receives as its A input the delayed input signal 108 and as its B input the input signal 106. Further, the second XXOR gate 310 of the pulse generation circuitry 202 receives as its A input the input signal 106 and as its B input the delayed input signal 108. Thus, the signal pulse 210, the delayed signal pulse 212 and the sample pulse 216 of the demodulator 600 are produced during differing time periods as compared to corresponding signals of the demodulator 300 of FIG. 3. Other than the connections to the pulse generation circuitry 202, the circuitry of the demodulator 600 corresponds substantially to the circuitry of the demodulator 300.

The pulse delay circuitry 204 receives the signal pulse 210 and produces the delayed signal pulse 212 based upon the $SELECT_2$ signal. The pulse conversion circuitry 206 receives the delayed signal pulse 212 and, in conjunction with the signal pulse 210, produces the converted signal 214 at node 317 during a pulse conversion segment of the operating cycle of the demodulator 600. The sampling circuitry 208 samples the converted signal 214 upon receipt of the signal pulse 210 during a sampling segment of the operating cycle and produces the demodulated output 116. The signal pulse 210 discharges the sampling circuitry 208 during a discharge segment of the operating cycle. Thus, the demodulator 600 also produces the demodulated output 116 based upon the input signal 106 during its operation.

Figure 7:
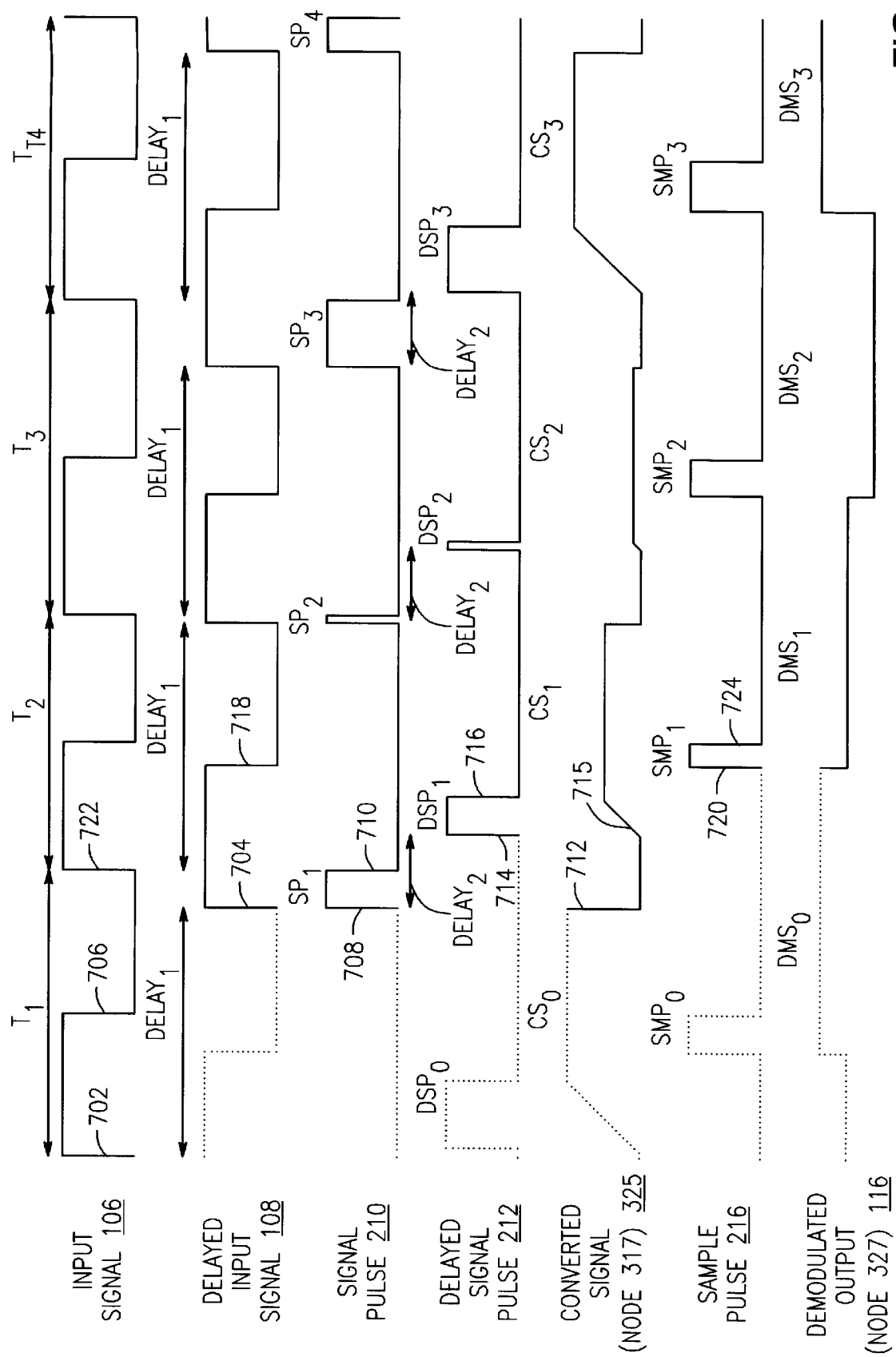
FIG. 7 is a signal timing diagram illustrating signal transitions produced during operation of the demodulator of FIG. 6.

FIG. 7 is a signal timing diagram illustrating signal transitions produced during operation of the demodulator 600 of FIG. 6. Four cycles of the input signal 106 are illustrated in FIG. 7 although operation of the 600 is discussed only during a first cycle $T_1$ of the input signal 106. The input signal 106 is provided to the first buffer 302 and, after buffering, to the second buffer 304 and the input delay circuitry 102. The input delay circuitry 102 delays the input signal 106 to produce the delayed input signal 108. As illustrated, the input delay circuitry 102 delays the input signal 106 by a time period $DELAY_1$. The time period $DELAY_1$ is set to be approximately 3 to 5 nanoseconds less that the minimum frequency of the input signal 106. When the input signal 106 has a base frequency of 13 MHz with a maximum frequency deviation of 450 kHz, with modulation and frequency error, the input signal 106 has a maximum frequency of 13.405 MHz with a corresponding period of 74.6 nS. With these operating parameters, $DELAY_1$ is approximately 70 nS. Thus, for rising edge 702 of the input signal 106, rising edge 704 of the delayed input signal 108 is produced with period $DELAY_1$ there between.

With the delayed input signal 108 provided as the A input to the first XXOR gate 306 of the pulse generation circuitry 202 and the input signal 106 provided as the B input to the first XXOR gate 306, and with the output of the first XXOR gate 306 provided as input to the buffer 308, the signal pulse 210 at $SP_1$ has a rising edge 708 corresponding to rising edge 704 of the delayed input signal 108. Further, the signal pulse 210 at $SP_1$ has a falling edge 710 corresponding to rising edge 706 of cycle $T_2$ of the input signal 106. Thus, with reference to rising edge 702 of the input signal 106 as time point zero, rising edge 708 of the signal pulse 210 at $SP_1$ occurs at a time $DELAY_1$ from the rising edge of cycle $T_1$ of the input signal 106. Further, falling edge 710 of pulse $SP_1$ of the signal pulse 210 occurs at the end of cycle $T_1$ of the input signal 106. Thus, the width of pulse $SP_1$ of the signal pulse 210 has a width equal to the period $T_1$ of the input signal 106 minus $DELAY_1$. For any period of the input signal 106, pulses $SP_1$ of the signal pulse 210 are linearly proportional (with an offset) to the corresponding period of the input signal 106. For period $T_1$, corresponding signal pulse $SP_1$ has a width equal to $(T_1-DELAY_1)$.

The signal pulse 210 discharges node 317 (the converted signal 214) during a discharge segment of the operating cycle of the demodulator 600 by enabling discharge transistor 318. Thus, at rising edge 708 of pulse $SP_1$ of the signal pulse 210, the converted signal 214 at node 317 goes to $V_{SS}$ at falling edge 712. Further, during the discharge segment, the pulse delay circuitry 204 receives the signal pulse 210 and produces the delayed signal pulse 212 after delay period $DELAY_2$. As previously described, the delay period $DELAY_2$ must be great enough so that falling edges of pulses of the signal pulse 210 do not overlap with the rising edges of the delayed signal pulse 212. For example, with respect to the operating cycle corresponding to cycle $T_1$ of the input signal 106, falling edge 710 of pulse $SP_1$ of the signal pulse 210 must occur prior to rising edge 714 of pulse $DSP_1$ of the delayed signal pulse 212. Falling edge 716 of pulse $DSP_1$ of the delayed signal pulse 212 occurs at a time $DELAY_2$ after falling edge 710 of pulse $SP_1$ of the signal pulse 210. Thus, the duration of pulse $DSP_1$ of the delayed signal pulse 212 is equal to the duration of pulse $SP_1$ of the signal pulse 210 and is therefore linearly proportional (minus the offset $DELAY_1$) to the period $T_1$ of the input signal 106.

During the subsequent pulse conversion segment of operation of the demodulator 600, the pulse conversion circuitry 206 generates the converted signal 214 based upon pulse $DSP_1$ of the delayed signal pulse 212. Upon receipt of pulse $DSP_1$ of the delayed signal pulse 212, the pulse conversion circuitry 206 ramps up the level of the voltage of the converted signal 214 at node 317 by enabling the ramping transistor 316 to charge the signal conversion capacitor 320. As illustrated, the converted signal 214 ramps up at transition 715 during pulse $DSP_1$ of the delayed signal pulse 212 to reach level $CS_1$. Thus, after the ramp up at 715, the level of the converted signal 214 at $CS_1$ is proportional to the width of pulse $DSP_1$ of the delayed signal pulse 212 and therefore proportional to the duration of period $T_1$ of the input signal 106.

Next, during a subsequent sampling segment of operation of the demodulator 600, the sample pulse 216 goes logic high at rising edge 720 of pulse SMP₁ and remains logic high until falling edge 724. As illustrated in FIG. 6, the sample pulse 216 is generated by the second XXOR gate 310 via the buffer 312 of the pulse generation circuitry 202. The second XXOR gate 310 receives as its A input the input signal 106 and as its B input the delayed input signal 108. Thus, pulse SMP₁ of the sample pulse 216 goes logic high at falling edge 718 of the delayed input signal 108 corresponding to cycle T₁ of the input signal 106 and goes logic low at falling edge 722 of cycle T₂ of the input signal 106. When the sample pulse 216 goes logic high at transition 720 of pulse SMP₁, the sample pulse 216 turns on the sampling transistor 324 and couples the sample voltage 325 at node 323 to node 327 to produce the demodulated output 116 at node 327. The pull-down transistor 322 is partially turned off to a level dependent upon the voltage level of the converted signal 214 at CS₁ produced at node 317. Thus, the sample voltage 325 level at node 323 is proportional to the duration period T₁ of the input signal 106 and the demodulated output 116 at node 327 is also proportional to the duration of period T₁ of the input signal 106.

In another embodiment of the present invention, the demodulator 600 produces the sample pulse 216 at every other cycle of the input signal 106 such that the demodulated output 116 is only generated every other cycle of the input signal 106. In still other embodiments, the demodulator 600 generates the sample pulse 216 at every N cycles of the input signal 106 so that the demodulated output 116 is generated every N cycles. Such operation may be required when circuitry sampling the demodulated output 116 samples at a lower frequency than the operating frequency of the demodulator 600 of the present invention, the sampling frequency at a multiple of a maximum frequency of the input signal 106.

Figure 8:
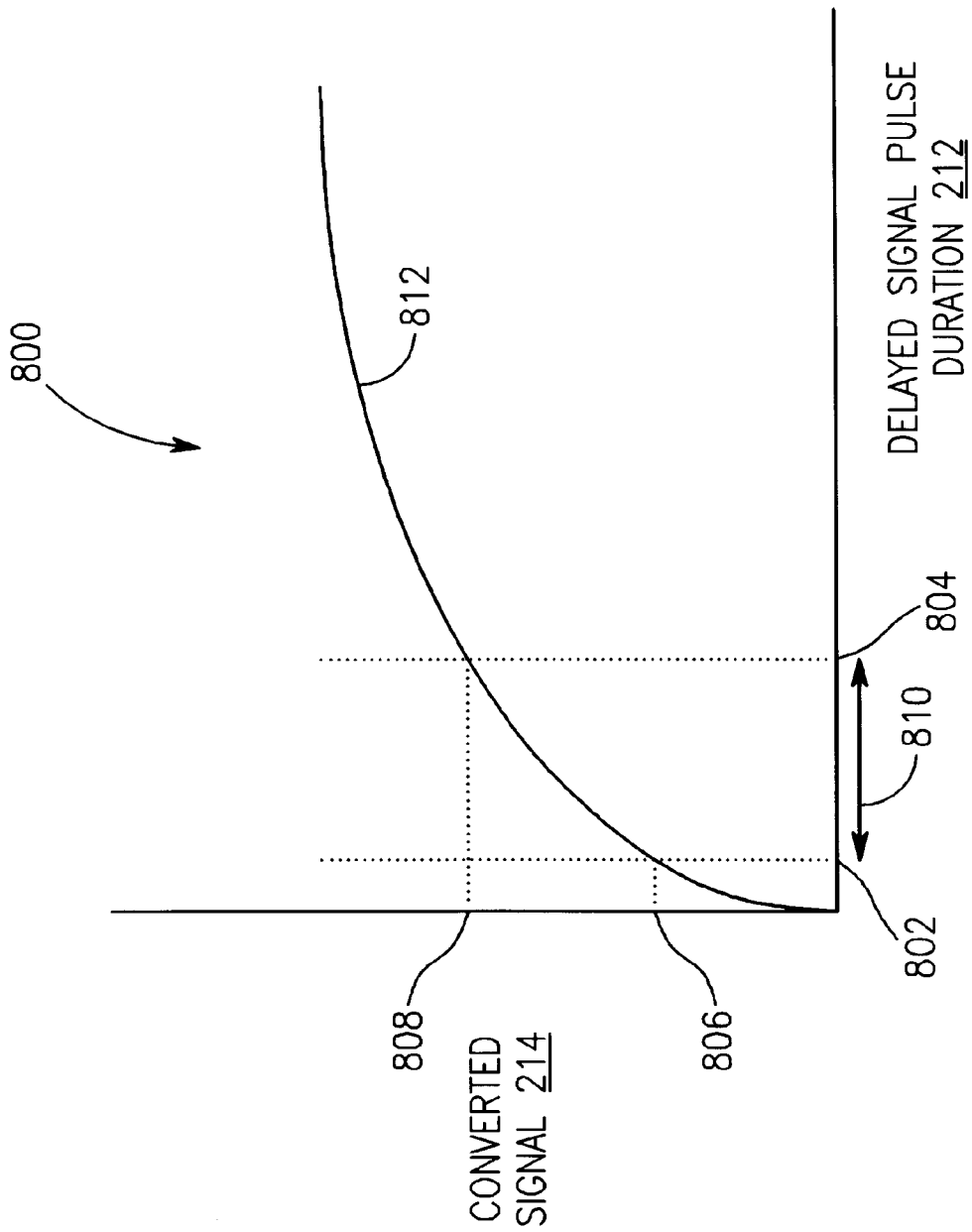
FIG. 8 is a graph illustrating a range of operation of a demodulator according to the present invention, the range of operation respective to a demodulated output produced by the demodulator and various intermediate signals.

FIG. 8 is a graph illustrating a range of operation 800 of a demodulator 600 in accordance with the present invention. The graph illustrates the converted signal 214 at node 317 for various durations of the delayed signal pulse 212. A minimum duration 802 of a pulse DSP$_X$ of the delayed signal pulse 212 produces the converted signal level 806 at node 317. A maximum duration 804 of a pulse DSP$_X$ of the delayed signal pulse 212 produces the converted signal 214 at level 808 at node 317. By varying DELAY₁, both the minimum and maximum width of a pulse DSP$_X$ of the delayed signal pulse 212 may be determined to define the operating range 810. The minimum duration 802 of the operating range 810 is selected so that the converted signal 214 at node 317 rises to a minimal level at each pulse conversion segment of the operating cycle of the demodulator 600. The maximum duration 804 of the operating range 810 is selected so that the signal pulse 210, the delayed signal pulse 212 and the sample pulse 216 do not overlap and so that the converted signal 214 does not extend onto a flat portion of the operating curve of the converted signal 214. Because the converted signal 214 operates substantially along a capacitive charging curve, maximum duration 804 is selected so that variations in pulse widths DSP$_X$ near the maximum duration 804 provide sufficient resolution in the converted signal 214. Further, proper selection of the signal conversion capacitor 320 further enhances the resolution in the converted signal 214. Likewise, proper selection of the sample holding capacitor 326 and the sampling transistor 324 also enhances the resolution in the demodulated output 116 generated at node 327.

The manner in which the demodulators 300 and 600 generate the sample pulse 216 also assists in maximizing resolution in the demodulated output 116. As was previously described, the demodulator 300 of FIG. 3 generates the converted signal 214 having a width proportional to the average period of successive cycles of the input signal 106. The sample pulse 216 generated by the demodulator 300 of FIG. 3 has a width proportional to the period of the current cycle of the input signal 106. With an FM signal comprising the input signal 106, periods of successive cycles of the input signal 106 vary little due to the substantially lower frequency of the coupled signal as compared to the frequency of the input signal 106. Thus, the width of corresponding pulses of the delayed signal pulse 212 and the sample pulse 216, DSP$_N$ and SMP$_N$ respectively, is substantially the same width for FM embodiments of the input signal 106. The width of the delayed signal pulse 214 determines the level of the converted signal 214 during a corresponding cycle. Both the level of the converted signal 214 and the width of the sample pulse 216 determine the level of demodulated output 116 during any particular cycle. For a given level of the converted signal 214, greater widths of the sample pulse 216 may produce higher levels of the demodulated output 116. Further, for a given level of the converted signal 214, lesser widths of the sample pulse 216 may produce lower levels of the demodulated output 116. Thus, the sample pulse 216 produces a compounding effect to increase resolution of the demodulated output 116.

Figure 9:
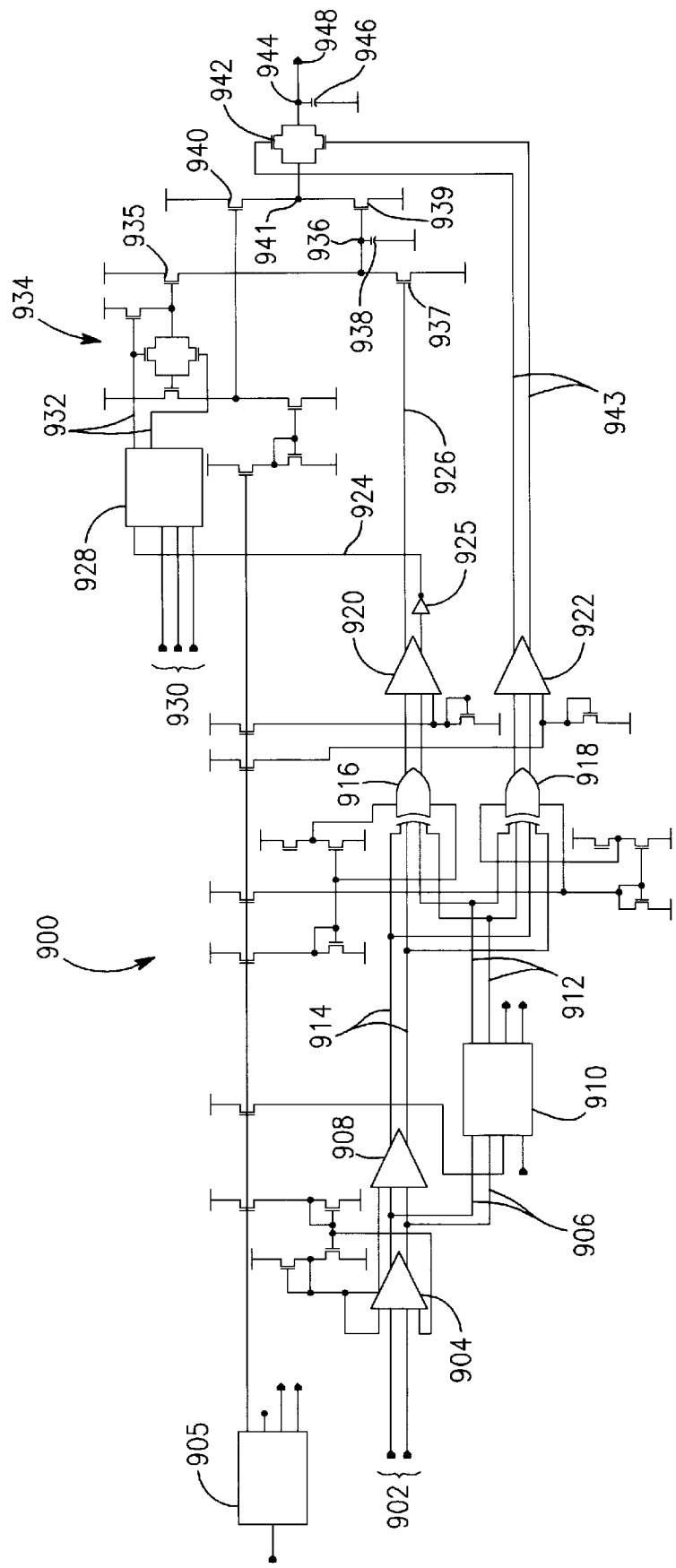
FIG. 9 is a schematic diagram illustrating a differential mode demodulator build according to the present invention.

FIG. 9 is a schematic diagram illustrating still another demodulator 900 build in accordance with the present invention. The demodulator 900 is implemented in a differential mode for enhanced noise resistance. Enabling circuitry 905 activates the circuitry of the demodulator 900 to allow disabled operation for power savings and reset. The demodulator 900 receives a differential input signal 902 at a buffer 904 which produces a first buffered differential input signal output 906 at both a second buffer 908 and input delay circuitry 910. The input delay circuitry 910 produces a differential delayed input signal 912 while the second buffer 914 produces a second buffered differential input signal 914. The input delay circuitry 910 provides a delay in accordance with the present invention.

A first differential XXOR gate 916 receives the second buffered differential input signal 914 as its A input and the differential delayed input signal 912 as its B input. A second differential XXOR gate 916 receives the differential delayed input signal 912 as its A input and the second buffered differential input signal 914 as its B input. The first differential XXOR gate 916 and the second differential XXOR gate 918 operate logically in accordance with the logic illustrated in Table 1. The first buffer 904, second buffer 908, input delay circuitry 910, first differential XXOR gate 916 and second differential XXOR gate 918 operate in accordance with CML logic. However, in another embodiment, the elements operate in accordance with CMOS logic.

A first CML to CMOS differential buffer 920 receives input from the first differential XXOR gate 916 and produces both a signal pulse 924 and a discharge pulse 926 via inverter 925. Pulse delay circuitry 928 receives the signal pulse 924 and a selection signal 930 and produces a delayed signal pulse 932 based upon the selection signal 930. During a discharge segment of the operating cycle of the demodulator 900, the discharge pulse 926 enables discharge transistor 937 to discharge a signal conversion capacitor 938, thus pulling the level of the converted signal 936 logic low. During a pulse conversion segment of the operating cycle where the delayed signal pulse 932 is converted to the converted signal, ramping circuitry 934, enabled during the delayed signal pulse 932 raises the converted signal 936 to a level proportional to the width of the delayed signal pulse 932 via pull-up converting transistor 935.

During a sampling segment of the operating cycle of the demodulator 900, the converted signal 936 turns off transistor 939 an amount proportional to the level of converted signal 936.

Further, during the sampling segment of the operating cycle, transistor 940 is turned on, attempting to pull up the voltage at node 941 to a logic high level. The level of node 941 is therefore at a level proportional to the level of the converted signal at node 936. When the second differential XXOR gate 918 drives a differential sample pulse 943 active via buffer 922, transmission gate 942 couples node 941 to output capacitor 946 thereby charging node 944 to produce the demodulated output 948. Overall, the level of the demodulated output 948 is proportional to the period of a respective cycle of the differential input signal 902.

In view of the above detailed description of the present invention and associated drawings, other modifications and variations will now become apparent to those skilled in the art. It should also be apparent that such other modifications and variations may be effected without departing from the spirit and scope of the present invention as set forth in the claims which follow.

We claim:

1. An integrated circuit formed entirely on a substrate, the integrated circuit including a demodulator comprising:

delay circuitry that receives an input signal and delays the input signal to create a delayed input signal;

pulse generation circuitry coupled to the delay circuitry that generates a signal pulse based upon the input signal and the delayed input signal having a duration that is proportional to at least one period of the input signal;

pulse conversion circuitry coupled to the pulse generation circuitry that generates a converted signal having a level based upon the duration of the signal pulse; and sampling circuitry coupled to the pulse conversion circuitry and the pulse generation circuitry that samples the converted signal and that generates the demodulated output based upon the level of the converted signal.

2. The integrated circuit of claim 1, the pulse generation circuitry further generating a sample pulse that is used by the sampling circuitry to synchronize sampling of the converted signal.

3. The integrated circuit of claim 2, the pulse generation circuitry generating the sample pulse with a duration that is proportional to at least one period of the input signal.

4. The integrated circuit of claim 1, the pulse generation circuitry further comprising:

pulse delay circuitry that generates a delayed signal pulse based upon the signal pulse; and ramping circuitry coupled to the pulse delay circuitry that generates the converted signal based upon a duration of the delayed signal pulse.

5. The integrated circuit of claim 4, the pulse delay circuitry producing an adjustable delay based upon a selection signal.

6. The integrated circuit of claim 1, the delay circuitry producing a delay dependent upon a frequency of the input signal.

7. The integrated circuit of claim 1 formed on a single substrate as a monolithic integrated circuit.

8. The integrated circuit of claim 7, the delay circuitry comprising a plurality of coupled semiconductive circuit elements.

9. An integrated circuit formed entirely on a substrate, the integrated circuit including a demodulator comprising:

delay circuitry that receives an input signal and delays the input signal to create a delayed input signal;

pulse generation means coupled to the delay circuitry for generating a signal pulse having a duration proportional to at least one period of the input signal;

pulse conversion means for generating a converted signal having a level based upon the duration of the signal pulse; and sampling means for sampling the converted signal and for generating the demodulated output based upon the level of the converted signal.

10. The integrated circuit of claim 9, the pulse generation means comprising:

pulse delay means for generating a delayed signal pulse based upon the signal pulse; and ramping means for generating the converted signal based upon a duration of the delayed signal pulse.

11. The integrated circuit of claim 9, the pulse generation circuitry further generating a sample pulse that is received by the sampling circuitry and used to synchronize sampling of the converted signal.

12. The integrated circuit of claim 9, the delay circuitry comprising a plurality of coupled semiconductive circuit elements.

13. A demodulator comprising:

delay circuitry that receives an input signal and delays the input signal to create a delayed input signal;

pulse generation circuitry coupled to the delay circuitry that generates a signal pulse based upon the input signal and the delayed input signal having a duration that is proportional to at least one period of the input signal;

pulse conversion circuitry coupled to the pulse generation circuitry that generates a converted signal having a level based upon the duration of the signal pulse; and sampling circuitry coupled to the pulse conversion circuitry and the pulse generation circuitry that samples the converted signal and that generates the demodulated output based upon the level of the converted signal.

14. The demodulator of claim 13, the pulse generation circuitry further generating a sample pulse that is used by the sampling circuitry to synchronize sampling of the converted signal.

15. The demodulator of claim 14, the pulse generation circuitry generating the sample pulse with a duration that is proportional to at least one period of the input signal.

16. The demodulator of claim 13, the delay circuitry, pulse generation circuitry, pulse conversion circuitry and sampling circuitry formed on a single substrate as a monolithic integrated circuit.

* * * * *